United States Patent
Ashbrook et al.

(10) Patent No.: US 9,310,420 B2
(45) Date of Patent: Apr. 12, 2016

(54) PIXEL TEST IN A LIQUID CRYSTAL ON SILICON CHIP

(71) Applicant: FINISAR CORPORATION, Sunnyvale, CA (US)

(72) Inventors: Jonathan B. Ashbrook, Homer, IL (US); Lionel Li, San Francisco, CA (US); Brian R. Carey, Sunnyvale, CA (US)

(73) Assignee: FINISAR CORPORATION, Sunnyvale, CA (US)

( * ) Notice: Subject to any disclaimer, the term of this patent is extended or adjusted under 35 U.S.C. 154(b) by 432 days.

(21) Appl. No.: 13/749,525

(22) Filed: Jan. 24, 2013

(65) Prior Publication Data

US 2014/0204298 A1 Jul. 24, 2014

(51) Int. Cl.
*G02F 1/1365* (2006.01)
*G01R 31/26* (2014.01)
*G02F 1/1362* (2006.01)
*G09G 3/00* (2006.01)
*H04Q 11/00* (2006.01)

(52) U.S. Cl.
CPC ...... *G01R 31/2607* (2013.01); *G02F 1/136277* (2013.01); *G09G 3/006* (2013.01); *H04Q 11/0005* (2013.01); *G09G 2330/12* (2013.01); *H04Q 2011/0035* (2013.01); *H04Q 2011/0039* (2013.01)

(58) Field of Classification Search
None
See application file for complete search history.

(56) References Cited

U.S. PATENT DOCUMENTS

| | | | | |
|---|---|---|---|---|
| 4,989,602 | A | * | 2/1991 | Sholder et al. ............... 607/4 |
| 2004/0135596 | A1 | * | 7/2004 | Miyagawa et al. ........... 324/770 |
| 2005/0024081 | A1 | * | 2/2005 | Kuo et al. .................... 324/770 |
| 2007/0236430 | A1 | * | 10/2007 | Fish ...................... G09G 3/3233 345/82 |
| 2008/0007504 | A1 | * | 1/2008 | Kawaura et al. ............... 345/89 |
| 2009/0251948 | A1 | * | 10/2009 | Kajigaya et al. ............. 365/149 |

OTHER PUBLICATIONS

International Search Report and Written Opinion mailed Apr. 10, 2014 in related PCT Application No. PCT/US2014/013053.

* cited by examiner

*Primary Examiner* — Melissa Koval
*Assistant Examiner* — Courtney McDonnough
(74) *Attorney, Agent, or Firm* — Maschoff Brennan

(57) ABSTRACT

An example embodiment includes a continuity testing method of a pixel in a liquid crystal on silicon integrated circuit. The method includes writing a first voltage to a pixel. The pixel is isolated and a wire that is selectively coupled to the pixel is discharged. The method also includes enabling a sensing amplifier configured to sense voltage on the wire. The pixel is electrically coupled to the wire and a resultant voltage on the wire is sensed.

20 Claims, 5 Drawing Sheets

PIXEL TEST IN A LIQUID CRYSTAL ON SILICON CHIP

BACKGROUND

1. Field of the Invention

Embodiments described herein relate generally to optical switches. More particularly, example embodiments relate to liquid crystal on silicon integrated circuits (LCOS ICs) that may be included into optical switches.

2. Related Technology

Signal-carrying light may be multiplexed onto an optical fiber to increase the capacity of the optical fiber and/or enable bidirectional transmission. Optical switches are generally used to multiplex, de-multiplex, or dynamically route a particular channel of the signal-carrying light. One type of optical switch is a wavelength selector switch (WSS) which routes the particular channel based on the wavelength of the particular channel.

In some WSS, liquid crystal on silicon (LCOS) technology is used to create a display engine that deflects a wavelength of the particular channel. In LCOS technology, liquid crystals may be applied to a surface of a silicon chip. The silicon chip may be coated with a reflective layer. For example, the reflective layer may include an aluminized layer. Additionally, in LCOS technology, the display engine may include multiple pixels. Through introduction and alteration of electrical voltage applied to the pixels, the pixels create an electrically controlled grating that routes the particular channel in a deflected direction.

The subject matter claimed herein is not limited to embodiments that solve any disadvantages or that operate only in environments such as those described above. Rather, this background is only provided to illustrate one exemplary technology area where some embodiments described herein may be practiced

BRIEF SUMMARY OF SOME EXAMPLE EMBODIMENTS

Embodiments described herein relate generally to optical switches. More particularly, example embodiments relate to liquid crystal on silicon integrated circuits (LCOS ICs) that may be included in optical switches.

An example embodiment includes a continuity testing method of a pixel in a LCOS IC. The method includes writing a first voltage to a pixel. The pixel is isolated and a wire that is selectively coupled to the pixel is discharged. The method also includes enabling a sensing amplifier configured to sense voltage on the wire. The pixel is electrically connected to the wire and a resultant voltage on the wire is sensed.

Another example embodiment includes a pixel continuity testing system on a LCOS IC. The testing system includes a first pixel, a first wire, a yank structure, and a sensing amplifier. The first wire is selectively coupled to the first pixel via a first pixel switch. The yank structure includes a yank up switch configured to couple the first pixel to a first voltage source and a yank down switch configured to couple the first wire to a second voltage source. The sensing amplifier is configured to be selectively coupled to the first wire via a sensing amplifier switch and configured to sense a first resultant voltage on the first wire following the first pixel being coupled to the first voltage source.

Another embodiment includes a LCOS IC. The LCOS IC includes multiple pixels, a yank structure, and multiple sensing amplifiers. The pixels are arranged in rows of pixels and in columns of pixels, the columns of pixels are electrically coupled via column wires. The yank structure includes a yank up switch configured to couple the columns of pixels to a first voltage source and a yank down switch configured to couple the columns of pixels to an electrical ground. Each of the sensing amplifiers is configured to sense a resultant voltage on at least one of the column wires.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features and advantages of the invention will be set forth in the description, which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof, which are illustrated in the appended drawings. It is appreciated that these drawings depict only typical embodiments of the invention and are, therefore, not to be considered limiting of its scope. The invention will be described and explained with additional specificity and detail through the use of the accompanying drawings in which.

DETAILED DESCRIPTION OF SOME EXAMPLE EMBODIMENTS

Embodiments described herein relate generally to optical switches. More particularly, example embodiments relate to liquid crystal on silicon integrated circuits (LCOS ICs) that may be included in optical switches. An example embodiment includes a pixel continuity testing system for a LCOS IC. The testing system includes a wire that is selectively coupled to a pixel via a pixel switch. The wire is also selectively coupled to a sensing amplifier via a sensing amplifier switch. A yank up switch couples the pixel to a first voltage. The yank down switch couples the wire to a second voltage. The sensing amplifier senses a resultant voltage on the first wire when the wire is coupled to the first pixel. Some additional example embodiments of the present invention will be explained with reference to the accompanying drawings.

Figure 1:
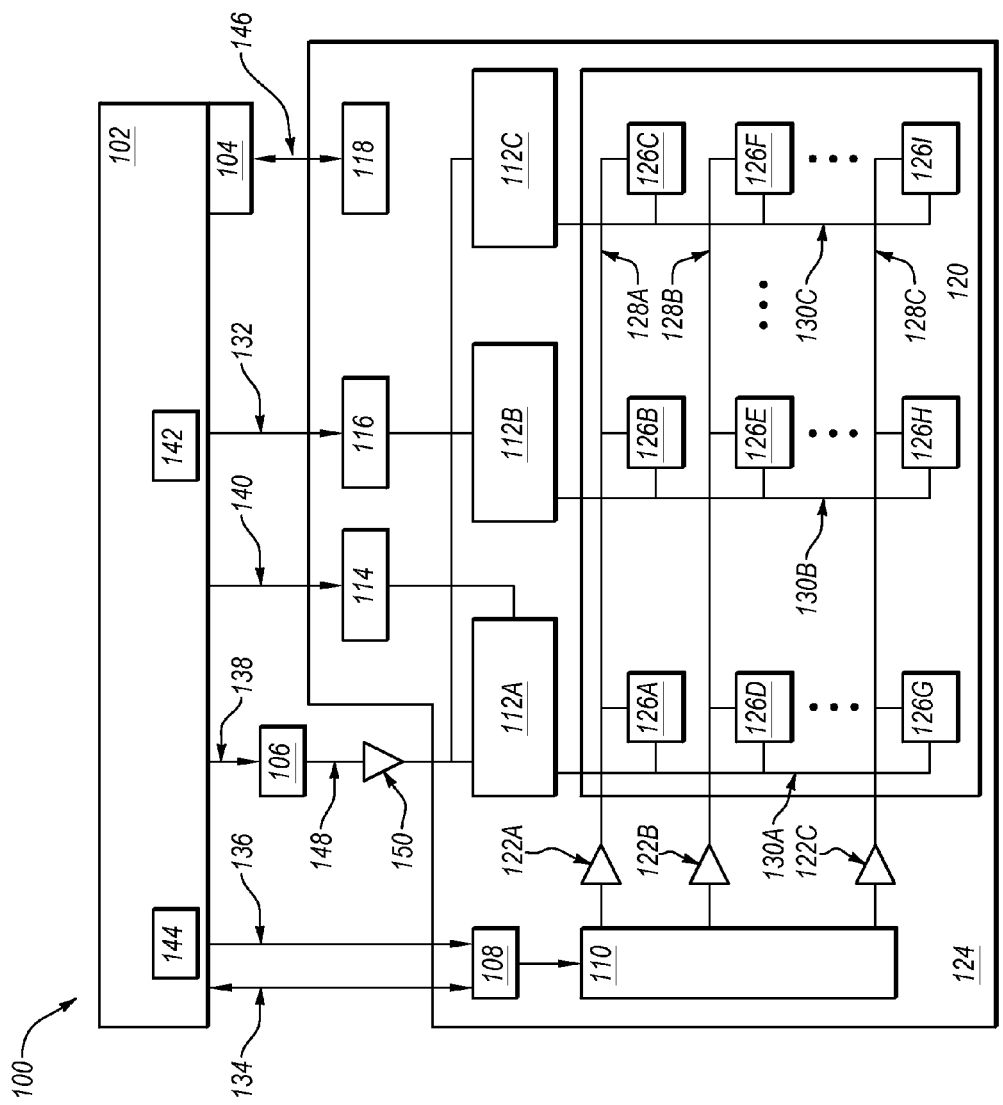
FIG. 1 is a block diagram of an example liquid crystal on silicon (LCOS) system in which the embodiments disclosed herein may be implemented.

FIG. 1 is a block diagram of an example liquid crystal on silicon (LCOS) system 100 in which the embodiments disclosed herein may be implemented. Generally, the LCOS system 100 writes images used to select wavelength or channels of optical signal-carrying light (optical signals). The LCOS system 100 can include a driver chip such as a field-programmable gate array (FPGA) 102 that controls the liquid crystal on silicon integrated circuit (LCOS IC) 124. To control the LCOS IC 124, the FPGA 102 communicates commands, synchronization signals, digital data, varying analog and/or digital signals, or some combination thereof. Additionally, the FPGA 102 may receive various analog and/or digital data signals, output synchronization signals, etc. from the LCOS IC 124.

The FPGA 102 is an integrated circuit (IC) with logic blocks, which may be configured to perform one or more control functions of the LCOS IC 124. The FPGA 102 may be configured and/or programmed after the LCOS system 100 is delivered to a user or following manufacturing of the FPGA 102. In some alternative embodiments the driver chip may include an application-specific integrated circuit (ASIC) or another suitable driver chip having substantially equivalent capabilities of the FPGA 102.

The FPGA 102 may include a digital port 142 which may communicate with a demultiplexing module 116 included in the LCOS IC 124. An example of the digital port 142 may include a low-voltage differential signal (LVDS) pair. The FPGA 102 may communicate digital data through the digital port 142 to the demultiplexing module 116. In FIG. 1, arrow 132 represents the communication of digital data to the demultiplexing module 116. Digital data may include, but is not limited to, a digital clock signal that may be used as a synchronization signal and digital image data for one or more pixels 126A-126I (generally, pixel 126 or pixels 126) included in the LCOS IC 124. The digital image data includes a digital representation of an image the LCOS IC 124 displays. The digital image data may be formatted as 6 bit per pixel, 7 bit per pixel, or 8 bit per pixel, for example. The digital data, or some portion thereof, may be communicated to one or more column drivers 112A-112C (generally, column driver 112 or column drivers 112) which may then be communicated to the pixels 126.

Some embodiments of the FPGA 102 may include multiple digital ports 142 and/or the LCOS IC 124 may include multiple demultiplexing modules 116. In embodiments in which the FPGA 102 includes multiple digital ports 142, the FPGA 102 may communicate a specific or a set amount of digital data through each of the digital ports 142 in parallel. For example, in some embodiments, the FPGA 102 includes thirty-two digital ports 142. Each of the thirty-two digital ports 142 may communicate digital image data for a bank of pixels 126, including sixty columns of pixels 126.

The FPGA 102 may also include a command port 144 that communicates commands to a command decoder 108. In FIG. 1, arrow 136 represents the communication of commands to the command decoder 108. The commands may include one or more actions and/or functions for the LCOS IC 124 to perform. For example, a command may include timing of operations to write a row of the pixels 126. A timing command may be controlled by the FPGA 102 via the command port 144. Additionally or alternatively, a command may include a digital clock signal that may be used as a synchronization signal. In some embodiments, the FPGA 102 may include multiple command ports 144.

The command decoder 108 and the command port 144 may also communicate additional signals. In FIG. 1, double-ended arrow 134 represents the communication of additional signals between the command port 144 and the command decoder 108. For example, the additional signals may include, but are not limited to, an auxiliary digital data signal, a reset signal, data out signals from the LCOS IC 124, and output clock signals from the LCOS IC 124. The reset signal and the auxiliary digital data signal may include a digital clock signal as a synchronization signal. The data out signals and the output clock signals may communicate information regarding synchronization and operational status of the LCOS IC 124 to the FPGA 102.

The FPGA 102 may also include an analog module 104 that communicates analog signals with an LCOS analog module 118. In FIG. 1, the double-ended arrow 146 represents the communication between the analog module 104 and the LCOS analog module 118.

The FPGA 102 may also communicate a digital ramp signal to a digital to analog converter (DAC) 106. In FIG. 1, arrow 138 represents the communication of the digital ramp signal to the DAC 106. The DAC 106 receives the digital ramp signal and outputs an analog ramp signal related to the digital ramp signal. The digital ramp signal is a binary number that represents and is proportional to an analog voltage of the analog ramp signal output from the DAC 106.

In some embodiment, the digital ramp signal includes a series of binary numbers that are converted to a monotonically varying voltage which ramps from an initial voltage to a final voltage. The term "ramp" refers to the behavior of incrementally varying at a defined rate. That is, in some embodiments, an initial binary number of the digital ramp signal is converted to an initial voltage which may be as high as about 12 volts (V). The digital ramp signal may subsequently include binary numbers resulting in an analog ramp signal that monotonically steps down to a final voltage. Alternatively, an initial binary number of the digital ramp signal can be converted to an initial voltage which may be as low as 0 V. The digital ramp signal may subsequently include binary numbers that result in voltages that monotonically step up to a final voltage. In some embodiments, each step may be a predetermined time interval during which the digital ramp signal includes a binary number that results in a predetermined change in voltage. Additionally, the digital ramp signal may vary according to a gamma curve, which can correct for nonlinear optical response of LCOS material.

The digital ramp signal is not limited to the series of binary numbers that result in the monotonically ramping voltage. The digital ramp signal can include a series of binary numbers that result in multiple patterns or progressions of voltages. For example, the digital ramp signal can include binary numbers that result in a set of increasing voltages and then a set of decreasing voltages, vice versa, or some other suitable pattern resulting in voltages covering the range of voltages to drive the pixels 126 of the LCOS IC 124A.

As stated above, the DAC 106 converts the digital ramp signal to an analog ramp signal representative of the binary number included in the digital ramp signal. Accordingly, the analog ramp signal is an analog representation of the digital ramp signal. The analog ramp signal may exhibit incrementally varying behavior equivalent or related to the digital ramp signal. Thus, in some embodiments, the analog ramp signal monotonously varies from the initial voltage to the final voltage, supplying a varying voltage signal to the pixels 126. More specifically, the analog ramp signal supplies target voltages to the pixels 126. The target voltages are defined voltages within the inclusive range of the initial voltage to the final voltage of the analog ramp signal. The LCOS IC 124A operates, at least partially, through driving the target voltages to the pixels 126.

A brightness of a pixel 126 may be determined by the magnitude of a target voltage supplied to the pixel 126. Thus, the brightness of the pixel 126 is controlled by driving the analog ramp signal during the time in which the target voltage of the analog ramp signal is equal to the voltage corresponding to a desired brightness. Pixels 126 may include multiple levels of brightness. For example, in some embodiments the pixel 126 can be programmed to display 256 or more levels of brightness. The process of supplying the pixels 126 with target voltages may be referred to as "writing an image."

Additionally, the analog ramp signal may monotonically vary from the initial voltage to the final voltage once per writing cycle of the pixels 126. The initial voltage and the final voltage may periodically change, interchange, or turn around. That is, in a first writing cycle, the final voltage may be greater than the initial voltage. In a second writing cycle, the initial voltage may be greater than the final voltage. In a third cycle, the final voltage may again be greater than the initial voltage. The initial voltage and the final voltage may continue to change in this pattern.

To determine when to supply the analog ramp signal to the pixels 126, the FPGA 102 may also communicate a ramp counter enable signal to a ramp counter 114 included in the LCOS IC 124. In FIG. 1, arrow 140 represents the communication of the ramp counter enable signal to the ramp counter 114. Generally, the ramp counter 114 receives the ramp counter enable signal from the FPGA 102, which enables or turns on the ramp counter 114. Once enabled, the ramp counter 114 counts or tracks the number of predetermined time intervals of the digital ramp signal that have occurred since receiving the ramp counter enable signal. The number of predetermined time intervals of the digital ramp signal may be equivalent and/or related to the number of predetermined time intervals of the analog ramp signal. More specifically, in some embodiments, the digital ramp signal may include a ramp clock signal. The ramp clock signal may act as a synchronization signal. The ramp counter 114 may track and/or count the number of predetermined time intervals included in the ramp clock signal following the reception of the ramp counter enable signal. The ramp counter 114 may output or otherwise make available a ramp step signal indicating the number of predetermined time intervals.

The ramp counter 114 may be coupled to the column drivers 112. The ramp counter 114 may communicate the ramp step signal to the column drivers 112. Thus, the ramp counter 114 and the ramp step signal may be used to determine the voltage of the analog ramp signal at a specific time. That is, the voltage of the analog ramp signal may be calculated if the initial voltage resulting from an initial binary number of the digital ramp signal, the predetermined voltage change per predetermined time interval, and the ramp step signal are known.

Referring back to the DAC 106, the analog ramp signal exiting the DAC 106, which is indicated by the line 148, enters an external buffer 150. The external buffer 150 may buffer the DAC 106 and/or the FPGA 102 from the LCOS IC 124. From the external buffer 150, the analog ramp signal enters the LCOS IC 124 and supplies the column drivers 112, which then supplies the pixels 126 or some subset thereof included in an array core 120.

Each of the pixels 126 may include a NMOS/PMOS complementary switch, a metal insulator-metal (MIM) capacitor, and a piece of top-layer metal. The complementary switch may enable linear transfer of voltage supplied by the column drivers 112 to enter the pixel 126. The MIM capacitor may be included to provide enough capacitive storage to limit charge leakage during a field time. In the depicted embodiment, the array core 120 includes nine pixels 126. However, this depiction is not limiting. The ellipses are included to illustrate that the array core 120 may include more than nine pixels 126. In some embodiments, the array core 120 may be separated into banks of columns which banks of columns may be coupled to one of the digital port 142 (described above).

In this and other embodiments, the array core 120 includes the pixels 126 that may be organized into columns and rows. The pixels 126 in each row may be electrically coupled to a row decode 110 via a row wire 128A-128C (generally, row wire 128 or row wires 128). The row decode 110 may receive commands from the command decoder 108. Specifically, the row decode 110 may receive commands related to activation of the pixels 126 in a row. The row decode 110 may then communicate the command related to activation through a row enable amplifier 122A-122C (generally, row enable amplifier 122 or row enable amplifiers 122), along one of the row wires 128 to the pixels 126 in the row. The activation signal enables or triggers the receiving pixels (i.e., the pixels 126 in the row coupled to the row enable amplifier 122) to become activated such that the pixels 126 may receive one or more signals supplied by one of the column drivers 112.

In some embodiments, the pixels 126 may be activated row by row. That is, the first row enable amplifier 122A communicates the activation signal to the first pixel 126A, the second pixel 126B, and the third pixel 126C through the first row wire 128A. After the first pixel 126A, the second pixel 126B, and the third pixel 126C are written, the second row enable amplifier 122B then communicates the activation signal to the fourth pixel 126D, the fifth pixel 126E, and the sixth pixel 126F through the second row wire 128B.

The pixels 126 in each column may be electrically coupled to one of the column drivers 112 via one or more column wires 130A-130C (generally, column wire 130 or column wires 130). Each of the column drivers 112 supplies one or more signals to the pixels 126 in a column via the column wire 130.

Figure 2:
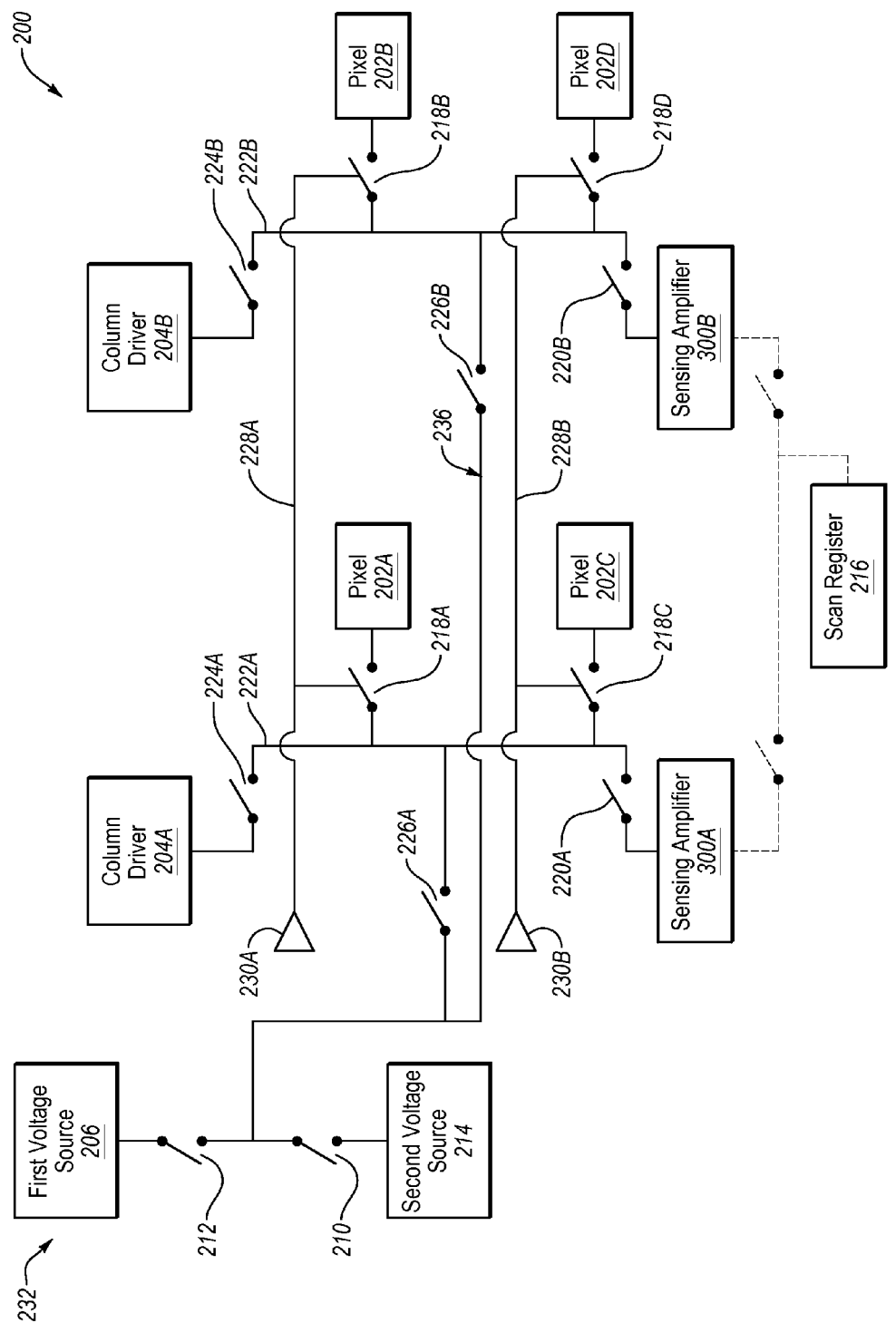
FIG. 2 is a block diagram of a pixel continuity testing system (testing system) which may be integrated into the LCOS system of FIG. 1.

FIG. 2 is a block diagram of a pixel continuity testing system (testing system) 200 which may be integrated into the LCOS system of FIG. 1. Generally, the testing system 200 may perform a continuity test on pixels 202A-202D (generally, pixel 202 or pixels 202). A continuity test may detect, for example, pixels 202 that may be damaged and/or nonfunctional. The testing system 200 depicted in FIG. 2 includes four pixels 202: a first pixel 202A, a second pixel 202B, a third pixel 202C, and a fourth pixel 202D. However, the testing system 200 in FIG. 2 represents a simplified version of the testing system 200. The principles disclosed with respect to the testing system 200 may be scaled to be integrated into a testing system including more than four pixels 202.

In general, the pixels 202 may be substantially similar to and/or correspond to the pixels 126 described with respect to FIG. 1 and may be essentially identical to one another. The pixels 202 may be organized into columns and rows with a yank wire 236, row wires 228A and 228B, and column wires 222A and 222B. The row wires 228A and 228B are substantially similar to the row wires 128 and the column wires 222A and 222B are substantially similar to the column wires 130 discussed with reference to FIG. 1. The first pixel 202A and the third pixel 202C may be selectively coupled to a first column wire 222A and the second pixel 202B and the fourth pixel 202D may be selectively coupled to a second column wire 222B. Each pixel 202 is selectively coupled to one of the column wires 222A or 222B through operation of corresponding pixel switches 218A-218D. The pixel switches 218A-218D may be operated by one or more row enable amplifiers 230A and 230B positioned at an end of each of the row wires 228A and 228B.

As depicted in FIG. 2, the row enable amplifiers 230A and 230B are operational amplifiers. However, this depiction is not meant to be limiting. The row enable amplifiers 230A and 230B may be switches or some other suitable structure, for instance.

For example, the first pixel 202A may be coupled to the first column wire 222A by a first row enable amplifier 230A communicating a signal to close a first pixel switch 218A. Likewise, the fourth pixel 202D may be isolated from the second column wire 222B by a second row enable amplifier 230B communicating a signal to open a fourth pixel switch 218D. In a similar fashion, the second pixel 202B and the third pixel 202C may be selectively coupled to the first column wire 222A and the second column wire 222B, respectively. As used herein the term "open" refers to a state of a switch or amplifier in which the flow of electricity stops. Conversely, the term "closed" refers to a state of a switch or amplifier in which the flow of electricity is enabled.

The yank wire 236 selectively couples the first column wire 222A and the second column wire 222B to a yank structure 232. More specifically, operation of a first column yank switch 226A selectively couples the yank structure 232 to the first column wire 222A and a second column yank switch 226B selectively couples the yank structure 232 to the second column wire 222B. Some additional details of the yank structure 232 are provided below.

In some embodiments, the testing system 200 may also include column drivers 204A and 204B which may be similar to and/or correspond to the column drivers 112 described with respect to FIG. 1. That is, the column drivers 204A and 204B may write images to one or more of the pixels 202. A first column driver 204A may be selectively coupled to the first column wire 222A via a first column driver switch 224A and a second column driver 204B may be selectively coupled to the second column wire 222B via a second column driver switch 224B. Accordingly, the column drivers 204A and 204B may be isolated from the column wires 222A and 222B by opening the column driver switches 224A and 224B.

The testing system 200 may also include one or more sensing amplifiers 300A and 300B (generally, sensing amplifier 300 or sensing amplifiers 300). A first sensing amplifier 300A may be selectively coupled to the first column wire 222A via a first sensing amplifier switch 220A. For example, the first sensing amplifier 300A may be isolated from the first column wire 222A by opening a first sensing amplifier switch 220A. Additionally, the testing system 200 may include a second sensing amplifier 300B that may be selectively coupled to the second column wire 222B via a second sensing amplifier switch 220B. For example, the second sensing amplifier 300B may be isolated from the second column wire 222B by opening a second sensing amplifier switch 220B.

In some embodiments, instead of including the second sensing amplifier 300B, the first sensing amplifier 300A may also be selectively coupled to the second column wire 222B. In these and other embodiments, the testing system 200 may include an additional sensing amplifier switch (not shown) that isolates the first sensing amplifier 300A from the second column wire 222B.

Figure 3:
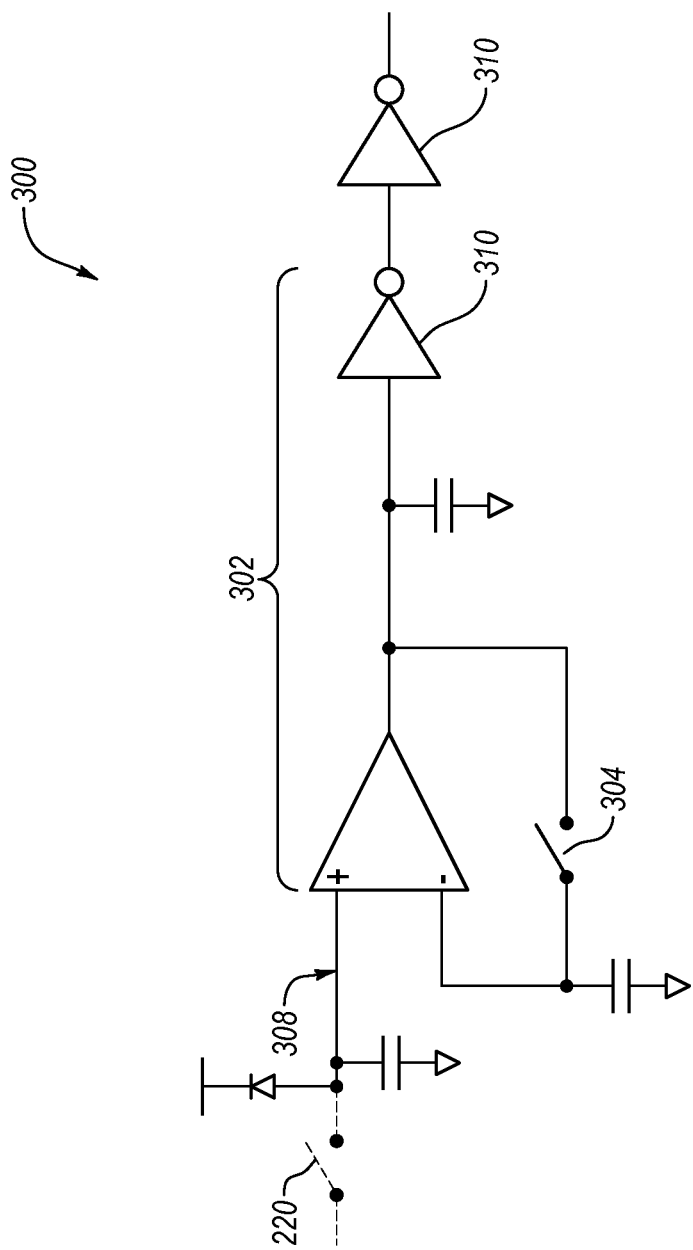
FIG. 3 is a block diagram of an example sensing amplifier that may be implemented in the testing system of FIG. 2.

FIG. 3 is a block diagram of an example sensing amplifier 300 that may be implemented in the testing system 200 depicted in FIG. 2. With combined reference to FIGS. 2 and 3, the sensing amplifier 300 may include the sensing amplifier switch 220, which may selectively couple the sensing amplifier 300 to one of the column wires 222A or 222B. The sensing amplifier switch 220 is depicted in both FIGS. 2 and 3.

Referring to FIG. 3, the sensing amplifier 300 may generally include a differential amplifier sensing circuit 302, a sample switch 304, and one or more inverting amplifiers 310. Generally, the sensing circuit 302 obtains a voltage at an input 308 when the sample switch 304 in a feedback leg is closed. The sensing circuit 302 amplifies and charges the voltage to trigger the inverting amplifiers 310. When the sample switch 304 is open, the sensing circuit 302 becomes a comparator circuit, thereby resetting the sensing circuit 302.

With combined reference to FIGS. 2 and 3, the sensing amplifier 300 may be selectively coupled to one of the column wires 222A or 222B via a sensing amplifier switch 220A or 220B. With the sensing amplifier switch 220A or 220B closed, the column wire 222A or 222B is electrically coupled to the input 308 of the sensing circuit 302. When the sample switch 304 closes, the sensing amplifier 300 can sense a voltage on the column wire 222A or 222B.

In some embodiments, the sensing amplifier 300 may include a trigger (not shown) including a programmable threshold. The threshold of the trigger may accommodate for process, voltage, and temperature (PVT) variation. Additionally or alternatively, in some embodiments, the capture time may be programmable.

Referring back to FIG. 2, the yank structure 232 may include a yank down switch 210 and a yank up switch 212 that selectively couple the column wires 222A and 222B to a second voltage source 214 and a first voltage source 206, respectively. To couple the first column wire 222A to the second voltage source 214, the yank down switch 210 and a first column yank switch 226A may be closed. When the first column wire 222A is coupled to the second voltage source 214, the rest of the testing system 200 may be isolated from the second voltage source 214. Specifically, the second column yank switch 226B, the first pixel switch 218A, the third pixel switch 218C, the first sensing amplifier switch 220A, and the first column driver switch 224A may be open.

Likewise to couple the second column wire 222B to the second voltage source 214, the yank down switch 210 and the second column yank switch 226B may be closed. When the second column wire 222B is coupled to the second voltage source 214, the rest of the testing system 200 may be isolated from the second voltage source 214. Additionally, the first column yank switch 226A, the second pixel switch 218B, the fourth pixel switch 218D, the second sensing amplifier switch 220B, and the second column driver switch 224B may be open.

In a similar fashion, through operation of the yank up switch 212 and the first and second column yank switches 226A and 226B, the column wires 222A and 222B may be selectively coupled to the first voltage source. The first voltage source 206 may be coupled to the first column wire 222A by closing the yank up switch 212 and the first column yank switch 226A. Likewise, the first voltage source 206 may be coupled to the second column wire 222B by closing the yank up switch 212 and the second column yank switch 226B. In either configuration, e.g., the first voltage source 206 being coupled to the first column wire or second column wire 222A or 222B, the rest of the testing system 200 may be isolated from the first voltage source 206.

In some embodiments, the first voltage source 206 may be greater than the second voltage source 214. For example, in some embodiments, the first voltage source 206 may be approximately equal to 10 V and the second voltage source 214 may be an electrical ground.

The testing system 200 includes the yank structure 232 and the column yank switches 226A and 226B to sequentially couple the column wires 222A or 222B and the pixels 202 to the first voltage source 206 and the second voltage source 214. By sequentially coupling the column wires 222A or 222B and the pixels 202 to the first voltage source 206 and the second voltage source 214, a resultant voltage (not shown) may be produced on the column wires 222A and 222B. The resultant voltage may be sensed by the sensing amplifier 300. The resultant voltage may be an indication of continuity of the pixels 202. A pixel continuity test may include sensing and analyzing the resultant voltage for each of the pixels 202. In the testing system 200, by changing the states of the switches (e.g., 212, 210, 226A, 226B, 218A-218D, 220A, 220B, and 224A-224D) described above in a particular sequence, the resultant voltages for each of the pixels 202 may be sensed by the sensing amplifiers 208A and 208B.

Additionally, in some embodiments, the testing system 200 may include a scan register 216. The scan register 216 may be selectively coupled to the first sensing amplifier 208A and the second sensing amplifier 208B. When coupled to the first sensing amplifier 208A or the second sensing amplifier 208B, the scan register 216 may record or store the resultant voltages sensed by the sensing amplifiers 208A and 208B. In alternative embodiments, the resultant voltages may be fed to a remote storage component.

Figure 4:
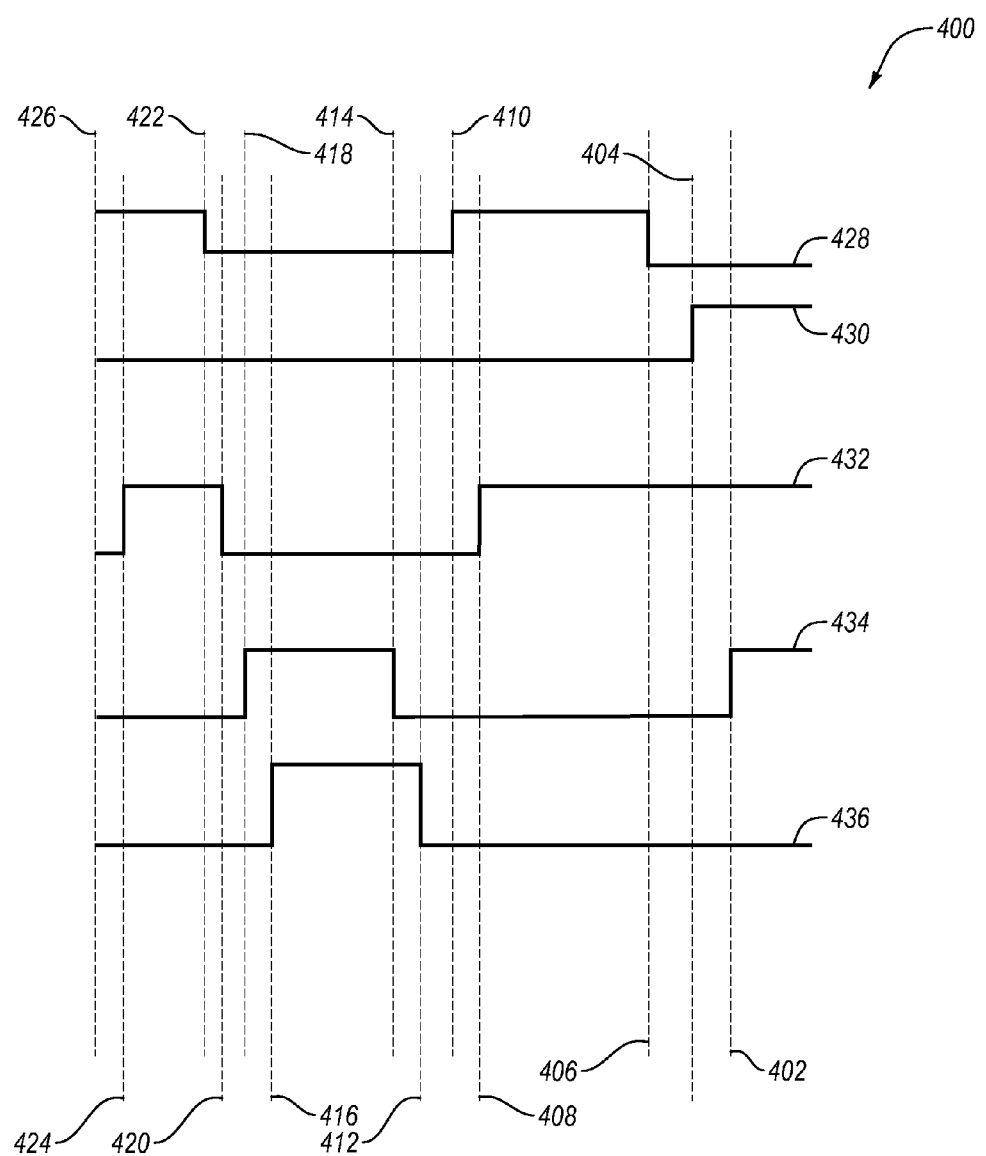
FIG. 4 is an example signal diagram depicting an example sequence of the testing system of FIG. 2.

FIG. 4 is an example signal diagram 400 depicting an example sequence of the testing system 200 depicted in FIG. 2. With combined reference to FIGS. 2 and 4, the signal diagram 400 depicts a sequence to sense a resultant voltage of the first pixel 202A. In the depicted embodiment, the first pixel 202A is tested; however, through a similar sequence any of the pixels 202 may be tested.

In FIG. 4, there are five signal lines representing the states of various switches in the testing system 200 depicted in FIG. 2 and the sensing amplifier 300 depicted in FIG. 3. Also, in FIG. 4 there are thirteen dashed, vertical lines 402-426 representing time included in the example sequence. The state of the switch is closed when the signal line is high and the state of the switch is open when the signal line is low. Specifically, with combined reference to FIGS. 2-4, a first signal 428 represents the state of the yank down switch 210. A second signal 430 represents the state of the sample switch 304. A third signal 432 represents the state of the first sensing amplifier switch 220A. A fourth signal 434 represents the state of the first pixel switch 218A. A fifth signal 436 represents the state of the yank up switch 212.

Throughout the example sequence, the first column yank switch 226A remains closed and the state of the first pixel switch 218A is controlled by the row enable amplifier 230A. The remaining switches (e.g., 224B, 218B, 218D, 220B, 226B, 218C, and 224A) depicted in FIG. 2 remain open during the example sequence.

Beginning at a first time 426, the yank down switch 210 is closed, the sample switch 304 is open, the first sensing amplifier switch 220A is open, the first pixel switch 218A is open, and the yank up switch 212 is open.

At a second time 424, the first sensing amplifier switch 220A closes. Thus, at time 424 the first column wire 222A and the first sensing amplifier 208A are coupled to the second voltage source 214. In embodiments in which the second voltage source 214 is an electrical ground, the first column wire 222A is grounded.

At times 422-416, a series of switches change state that results in an image being written to the first pixel 202A. First, at a third time 422 the yank down switch opens. At a fourth time 420, the first sensing amplifier switch 220A opens. At a fifth time 418, the first pixel switch 218A closes. At a sixth time 416, the yank up switch closes. In this configuration, a voltage from the first voltage source 206 is applied through the yank up switch 212 to the first pixel 202A. The voltage applied to the first pixel 202A writes the image to the first pixel 202A.

Additionally, in some embodiments, because the first row enable amplifier 230A controls the second pixel switch 218B, the first voltage source 206 may be coupled to the second pixel 202B as well. The image written to the first pixel 202A may be identical to the image written to the second pixel 202B.

At times 414-412 a series of switches change state that isolate the first pixel 202A, and thereby store charge in the first pixel 202A. At a seventh time 414, the first pixel switch 218A opens. At an eighth time 412, the yank up switch 212 opens. In this configuration, the first pixel 202A is isolated from the first column wire 222A.

At times 408-410 a series of switches change state that couple the first column wire 222A to the second voltage source 214. At a ninth time 410, the yank down switch 210 closes. At a tenth time 408, the first sensing amplifier switch 220A closes. Again, in this configuration, the first column wire 222A and the first sensing amplifier 208A are coupled to the second voltage source 214. In embodiments in which the second voltage source 214 is an electrical ground, in this configuration the first column wire 222A is discharged.

At an eleventh time 406, the yank down switch 210 opens. At a twelfth time 404, the sample switch 304 closes such that the first sensing amplifier 208A may sense the voltage on the first column wire 222A. At a thirteenth time 402, the first pixel switch 218A closes, coupling the first pixel 202A to the first column wire 222A. The charge stored in the first pixel 202A is shared with the first column wire 222A. The first sensing amplifier 208A can sense a resultant voltage on the first column wire 222A. In some embodiments, the pixels 202 may include a pixel capacitance, which may be different from a column wire capacitance. A difference in capacitance may result in the charge sharing discussed above.

Figure 5:
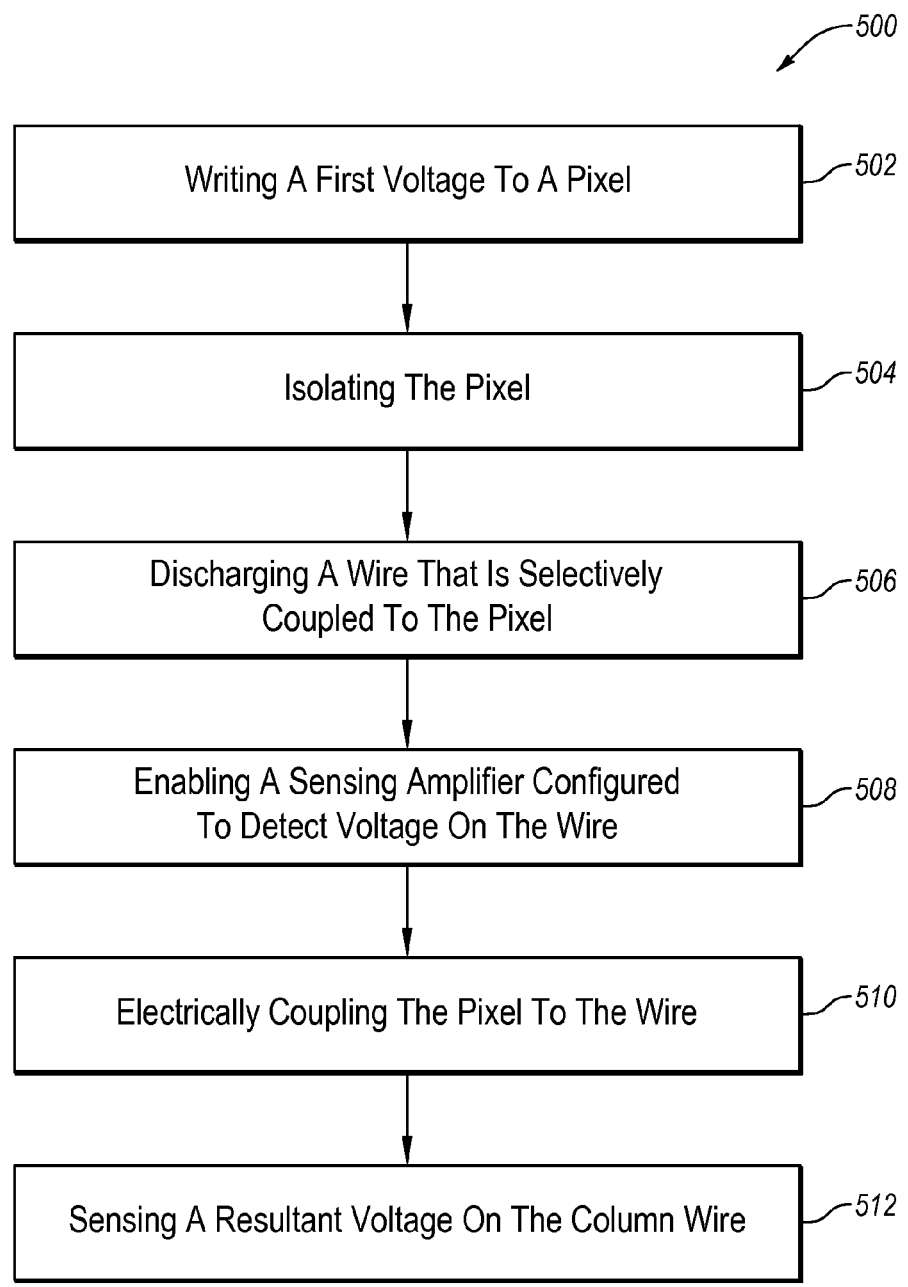
FIG. 5 is a flowchart of an example pixel continuity testing method that may be implemented in the LCOS system of FIG. 1.

FIG. 5 is a flowchart of an example pixel continuity testing method (method) 500. The method 500 can be implemented with the testing system 200 of FIG. 2 in some embodiments. One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the disclosed embodiments.

The method 500 may begin at 502 by writing a first voltage to a pixel. In some embodiments, writing the first voltage to the pixel may include closing a yank up switch coupled to a first voltage source.

At 504, the method 500 may include isolating the pixel. Isolating the pixel may include opening a pixel switch, which may be controlled by an enable amplifier. By isolating the pixel, the first voltage written to the pixel may be stored as a charge in the pixel.

At 506, the method 500 may include discharging a wire that is selectively coupled to the pixel. Discharging the wire may include closing a yank down switch coupled to an electrical ground. In some embodiments, the wire may be a column wire that electrically couples to the pixel and a second pixel. In this and other embodiments, the wire may be selectively coupled to the pixel and the second pixel via the pixel switch and a second pixel switch, respectively.

At 508, the method 500 may include enabling a sensing amplifier that senses voltage on the wire. The sensing amplifier may include a sensing circuit that includes a trigger with a threshold. In some embodiments, the threshold for the trigger of the sensing amplifier may be programmed to compensate for process, voltage, and temperature (PVT) variation. Additionally or alternatively, the sensing circuit may include a capture time that holds the voltage sensed by the sensing amplifier. In some of these embodiments, the capture time may be programmed.

At 510, the method 500 may include electrically connecting the pixel to the wire and connecting the pixel to the wire may include closing the pixel switch such that the charge stored in the pixel may be shared with the wire. The charge sharing may be a result of differences between a pixel capacitance of the pixel and a wire capacitance of the wire. For example, in some embodiments, the pixel capacitance is less than the wire capacitance.

At 512, the method 500 may include sensing a resultant voltage on the wire. The resultant voltage may include the charge shared between the pixel and the wire. The resultant voltage may indicate proper continuity of the pixel. In some embodiments, one sensing amplifier may be selectively coupled to multiple columns and/or multiple pixels in some sequence. This may enable the one sensing amplifier to sense the resultant voltage for the multiple pixels. In some embodiments including one sensing amplifier, the method 500 may be performed for each of the pixels individually.

Additionally, in some embodiments, a LCOS IC may include a system such as the testing system 200 of FIG. 2 that implements the method 500. The LCOS IC may record or store the resultant voltage in a scan register, for instance. Alternatively, the resultant voltage may be fed off the LCOS IC and/or stored remotely.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A continuity testing method of a pixel in a liquid crystal on silicon integrated circuit including a pixel continuity testing system having a plurality of pixels, each of the plurality of pixels includes an NMOS/PMOS complementary switch and a metal insulator-metal (MIM) capacitor, the method comprising:
writing a first voltage to a first pixel of the plurality of pixels, the writing the first voltage including closing a first pixel switch that selectively couples the first pixel to a wire and closing a yank up switch that couples the wire to a first voltage source such that a voltage of the first voltage source is applied through the yank up switch to the first pixel via the first pixel switch;
isolating the first pixel;
discharging a wire that is selectively coupled to the first pixel via the first pixel switch;
enabling a sensing amplifier configured to sense voltages on the wire;
electrically coupling the first pixel to the wire while isolating the wire from all other pixels of the plurality of pixels; and
sensing a resultant voltage on the wire.

2. The continuity testing method of claim 1, wherein isolating the first pixel comprises opening the first pixel switch.

3. The continuity testing method of claim 1, further comprising electrically coupling a second pixel of the plurality of pixels to the wire such that the first pixel and the second pixel are written to the first voltage.

4. The continuity testing method of claim 3, wherein the wire comprises a column wire, the column wire being configured to electrically couple the first pixel and the second pixel to a column driver.

5. The continuity testing method of claim 1, further comprising storing the resultant voltage to a scan register or feeding the resultant voltage off the liquid crystal on silicon integrated circuit.

6. The continuity testing method of claim 1, wherein a pixel capacitance of the first pixel is less than a wire capacitance of the wire such that when the first pixel is electrically connected to the wire, charge sharing occurs.

7. The continuity testing method of claim 1, further comprising:
programming a threshold for the sensing amplifier to compensate for process, voltage, and temperature (PVT) variation; and
programming a capture time for the sensing amplifier.

8. The continuity testing method of claim 1, wherein:
discharging the wire includes closing a yank down switch that couples the wire to an electrical ground.

9. A pixel continuity testing system of a liquid crystal on silicon integrated circuit, the system comprising:
a first pixel;
a second pixel, wherein each of the first pixel and the second pixel includes an NMOS/PMOS complementary switch and a metal insulator-metal (MIM) capacitor;
a first wire selectively coupled to the first pixel via a first pixel switch, the first wire also selectively coupled to the second pixel via a second pixel switch;
a yank structure including a yank up switch configured to couple the first wire to a first voltage source and a yank down switch configured to couple the first wire to a second voltage source; and
a sensing amplifier configured to be selectively coupled to the first wire via a sensing amplifier switch and configured to sense a first resultant voltage on the first wire from the first pixel following the closure of the first pixel switch and to sense a second resultant voltage on the wire from the second pixel following the closure of the second pixel switch.

10. The pixel testing system of claim 9, wherein the second voltage source comprises an electrical ground.

11. The pixel testing system of claim 9, further comprising a scan register that stores the first and the second resultant voltages.

12. The pixel testing system of claim 9, further comprising:
a first enable amplifier configured to control the state of the first pixel switch; and
a second enable amplifier configured to control the state of the second pixel switch.

13. The pixel testing system of claim 12, wherein the first wire comprises a first column wire.

14. The pixel testing system of claim 13, further comprising:
a third pixel;
a fourth pixel; and
a second column wire selectively coupled to the third pixel via a third pixel switch, the second column wire also selectively coupled to the fourth pixel via a fourth pixel switch,
wherein the first enable amplifier is configured to control the state of the third pixel switch and the second enable amplifier is configured to control the state of the fourth pixel switch.

15. The pixel testing system of claim 14, further comprising a yank wire, the yank wire including:
- a first column yank switch configured to selectively couple the first column wire to the yank structure; and
- a second column yank switch configured to selectively couple the second column wire to the yank structure.

16. The pixel testing system of claim 9, further comprising a column driver coupled to the first wire that writes an image to the first and second pixels.

17. The pixel testing system of claim 9, wherein the sensing amplifier comprises:
- a sensing circuit; and
- a trigger including a programmable threshold.

18. A liquid crystal on silicon integrated circuit comprising:
- a plurality of pixels including a first pixel, a second pixel, a third pixel, and a fourth pixel, wherein each of the first pixel, the second pixel, the third pixel, and the fourth pixel includes an NMOS/PMOS complementary switch and a metal insulator-metal (MIM) capacitor;
- a first column wire selectively coupled to the first pixel via a first pixel switch and selectively coupled to the second pixel via a second pixel switch;
- a second column wire selectively coupled to the third pixel via a third pixel switch and selectively coupled to the fourth pixel via a fourth pixel switch;
- a yank structure including a yank up switch configured to couple the first and second column wires to a first voltage source and a yank down switch configured to couple the first and second column wires to an electrical ground;
- a first row wire selectively coupled to the first pixel switch and selectively coupled to the third pixel switch;
- a second row wire selectively coupled to the second pixel switch and selectively coupled to the fourth pixel switch;
- a first sensing amplifier configured to sense a resultant voltage on the first column wire; and
- a second sensing amplifier configured to sense a resultant voltage on the second column wire.

19. The liquid crystal on silicon integrated circuit of claim 18, further comprising a first row enable amplifier that is configured to control the state of the first and the third pixel switches via the first row wire.

20. The liquid crystal on silicon integrated circuit of claim 19, wherein each of the first and the second sensing amplifiers is configured to sense a resultant voltage from a single one of the plurality of pixels.

* * * * *